US008070298B2

(12) United States Patent
Masood

(10) Patent No.: US 8,070,298 B2
(45) Date of Patent: Dec. 6, 2011

(54) LASER DISPLAY SYSTEM WITH OPTICAL FEEDBACK CONFIGURED TO REDUCE SPECKLE ARTIFACTS

(75) Inventor: Taha Masood, Issaquah, WA (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 13/100,158

(22) Filed: May 3, 2011

(65) Prior Publication Data
US 2011/0205504 A1    Aug. 25, 2011

Related U.S. Application Data

(62) Division of application No. 12/241,597, filed on Sep. 30, 2008, now Pat. No. 7,993,012.

(51) Int. Cl.
G03B 21/14  (2006.01)
G03B 21/26  (2006.01)
G03B 21/28  (2006.01)
G03H 1/12   (2006.01)
H01S 3/13   (2006.01)
H01S 5/00   (2006.01)

(52) U.S. Cl. ............ 353/69; 353/94; 353/99; 359/11; 372/29.014; 372/38.02; 372/50.12

(58) Field of Classification Search ............ 353/69, 353/94, 98, 99; 359/11; 372/29.014, 38.02, 372/50.12
See application file for complete search history.

(56) References Cited

U.S. PATENT DOCUMENTS

| 6,445,487 | B1 | 9/2002 | Roddy et al. | |
| 6,600,590 | B2 | 7/2003 | Roddy et al. | |
| 6,625,381 | B2 | 9/2003 | Roddy et al. | |
| 7,359,420 | B2 | 4/2008 | Shchegrov et al. | |
| 2007/0097335 | A1* | 5/2007 | Dvorkis et al. | 353/94 |
| 2007/0236670 | A1 | 10/2007 | Kamijima | |
| 2007/0285629 | A1* | 12/2007 | Yavid | 353/97 |
| 2008/0095203 | A1* | 4/2008 | Bratkovski et al. | 372/26 |
| 2008/0158513 | A1 | 7/2008 | Bartlett et al. | |

FOREIGN PATENT DOCUMENTS

| JP | 2006317681 | 11/2006 |
| JP | 2006323383 | 11/2006 |

OTHER PUBLICATIONS

Dingel, Benjamin "Speckle-Free Image in a Laser Diode Microscope by Using the Optical Feedback Effect", *Optical Letters*, vol. 18, No. 7 Apr. 1, 1993, 549-551.

(Continued)

Primary Examiner — Georgia Y Epps
Assistant Examiner — Magda Cruz
(74) Attorney, Agent, or Firm — Kevin D. Wills

(57) ABSTRACT

An imaging system (200) includes a plurality of laser sources (201) configured to produce a plurality of light beams (204). One or more optical alignment devices (220) orient the light beams (204) into a collimated light beam (205). A light modulator (203) modulates the collimated light beam (205) such that images (206) can be presented on a display surface (207). Speckle is reduced with an optical feedback device (221) that causes the laser sources (201) to operate in a coherence collapsed state. Examples of optical feedback devices (221) include partially reflective mirrors and beam splitter-mirror combinations.

5 Claims, 7 Drawing Sheets

OTHER PUBLICATIONS

Jones, R. J. "Influence on External Cavity Length on the Coherence Collapse Regime in Laser Diodes Subject to Optical Feedback", *IEE Proc-Optoelectron*, vol. 148, No. 1 Feb. 1, 2001, 7-12.

Trisnadi, Jahja I. "Speckle Contrast Reduction in Laser Projection Displays", *SPIE* vol. 4657 Apr. 26, 2002.

Woodward, S. L. "The Onset of Coherence Collapse in DBR Lasers", *IEEE Photonics Technology Letters*, vol. 2, No. 6 Jun. 1, 1990, 391-394.

* cited by examiner

US 8,070,298 B2

LASER DISPLAY SYSTEM WITH OPTICAL FEEDBACK CONFIGURED TO REDUCE SPECKLE ARTIFACTS

RELATED APPLICATIONS

The present application is a divisional of U.S. application Ser. No. 12/241,597, filed Sep. 30, 2008, which is incorporated herein by reference in its entirety for all purposes.

BACKGROUND

1. Technical Field

This invention relates generally to optical projection systems configured to reduce perceived speckle, and more particularly to a laser-based system employing optical feedback in an external cavity to cause multiple lasers to operate in a coherence collapsed state, thereby reducing speckle as perceived by a viewer.

2. Background Art

Laser projection devices facilitate the production of brilliant images created with vibrant colors. The image quality associated with laser-based projection systems is unmatched by systems using conventional projection devices. The advent of semiconductor lasers, such as laser diodes, allows these brilliant images to be created at a reasonable cost, while using small amounts of power. Laser diodes are small, compact, and relatively inexpensive. Further, the light from laser diodes is easily modulated to form complex images.

One practical drawback associated with using lasers in projection systems is the image artifact known as "speckle." Speckle occurs when a coherent light source is projected onto an imperfect projection medium. As the light is highly coherent, when it reflects off a rough surface, components of the light combine with other components to form patches of higher intensity light and lower intensity light. In a detector with a finite aperture, such as a human eye, these varied patches of intensity appear as speckles, as some small portions of the image look brighter than other small portions. Further, this spot-to-spot intensity difference can vary, which makes the speckles appear to move.

Turning now to FIG. 1, illustrated therein is a prior art system 100 in which an observer 101 may perceive speckle. Specifically, a coherent light source 101, such as a semiconductor-type laser, delivers a coherent beam 104 to a modulation device 103. The modulation device 103 modulates the coherent beam 104 into a modulated coherent beam 105 capable of forming an image. This modulated coherent beam 105 is then delivered to a projection medium, such as the projection screen 107 shown in FIG. 1.

As the projection screen 107 is imperfect, i.e., as it includes tiny bumps and crevices, the reflected light 108 has portions that combine and portions that cancel. As a result, the observer 102 views an image 106 that appears to be speckled. The presence of speckle often tends to perceptibly degrade the quality of the image produced using the laser projection system.

Numerous attempts have been made to control speckle. Prior art speckle reduction systems include attempts to introduce angle diversity into the coherent beam, attempts to introduce polarization diversity into the coherent beam, attempts to introduce wavelength diversity into the coherent beam, and so forth. Other devices employ diffusers, image displacing devices, and other complex systems. Some speckle reduction systems, such as those used with microscopes, employ long lengths of optical fiber in an attempt to stretch the projected light beyond a corresponding coherence length prior to delivering it to a user. A drawback associated with each of these systems is that they add substantial cost and complexity to the overall system design. For instance, time-varying diffusers require moving or vibrating parts that adversely affect the overall system size and complexity. Further, such systems tend to increase the power requirements of the overall system, thereby degrading efficiency.

There is thus a need for an improved speckle-reducing system for use with laser-based projection systems such as those employing semiconductor-type lasers.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
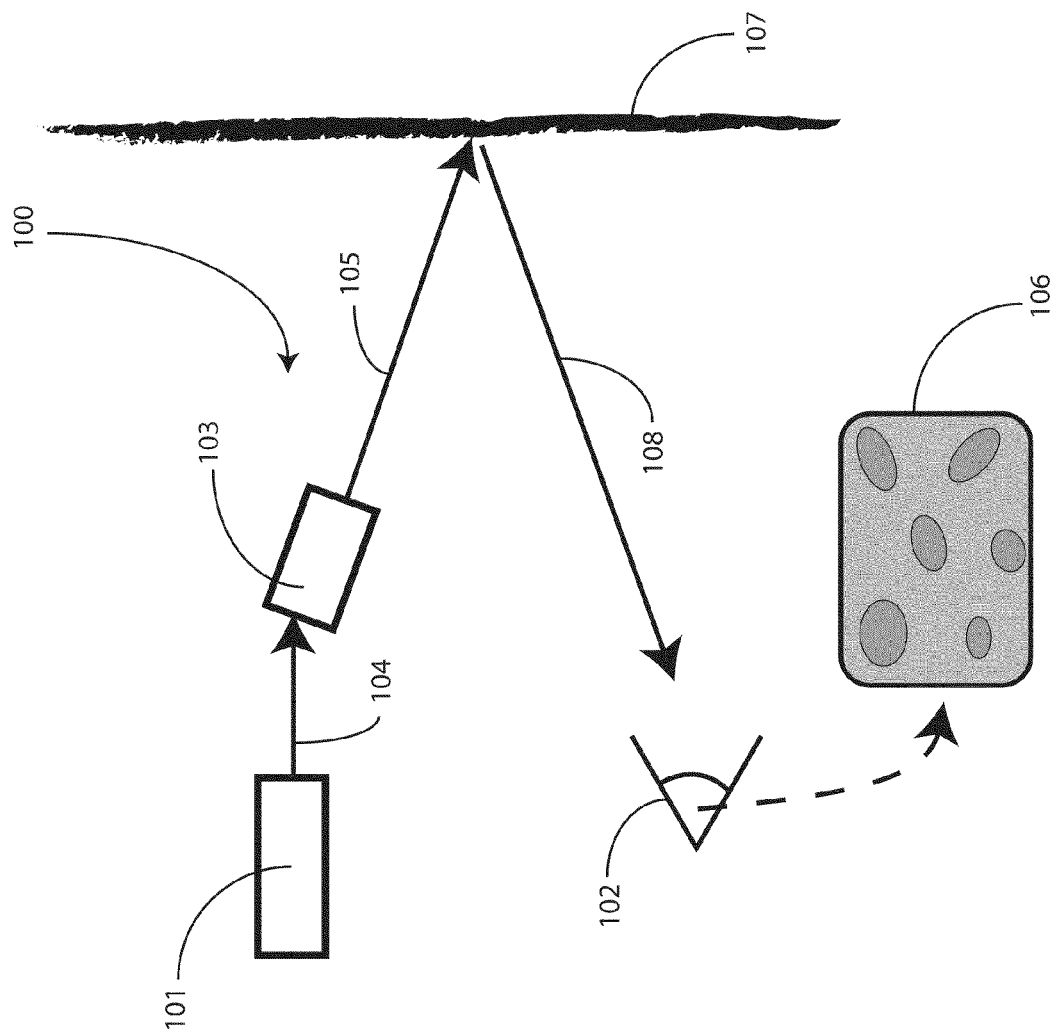
FIG. 1 illustrates a prior art laser-based projection system exhibiting speckle characteristics.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to an imaging system configured to reduce perceived speckle. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of reducing speckle as described herein. The non-processor circuits may include, but are not limited to, microprocessors, scanning mirrors, image modulation devices, memory devices, clock circuits, power circuits, and so forth. As such, these functions may be interpreted as steps of a method to perform speckle reduction. Alternatively, some or all functions could be implemented by a state machine that has no stored program instructions, or in one or more application specific integrated circuits, in which each function or some combinations of certain of the functions are implemented as custom logic. Of course, a combination of the two approaches could be used. It is expected that one of ordinary skill, notwithstanding possibly significant effort and many design choices motivated by, for example, available time, current technology, and economic considerations, when guided by the concepts and principles disclosed herein will be readily capable of generating such programs and circuits with minimal experimentation.

Embodiments of the invention are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Embodiments of the present invention provide a multi-laser projection system with speckle reducing components. The speckle reduction is performed simply, in a low cost and efficient manner, by delivering optical feedback to the laser sources. The optical feedback first destabilizes the minimum linewidth mode of each laser source, and eventually results in coherence collapse when the amplitude of the optical feedback amplitude reaches a threshold.

In one embodiment, a plurality of laser sources is configured to produce a plurality of light beams. Optical elements, such as dichroic mirrors, are then used to orient each of these light beams into a collimated, coherent light beam. A modulation device, such as a Microelectromechanical System (MEMS) scanning mirror, digital light projection (DLP) system, or other modulation device, modulates the collimated, coherent light beam to present an image on a projection medium or display surface.

Speckle is reduced in embodiments of the invention via an optical feedback device, such as a partially reflective mirror, beam splitter-mirror combination, or other device capable of separating the collimated, coherent light beam into a projection component and a feedback component. The optical feedback device is disposed between the laser sources and the modulation device, thereby defining an external cavity with respect to each light source. The optical feedback device delivers the feedback component back to the laser sources, thereby causing each laser source to operate in a coherence collapsed state. The coherence collapsed state results in a projection beam that has a broader spectral width, which yields less perceived speckle. Embodiments of the invention are small and compact, and are suitable for use as projection systems in portable electronic devices.

Figure 2:
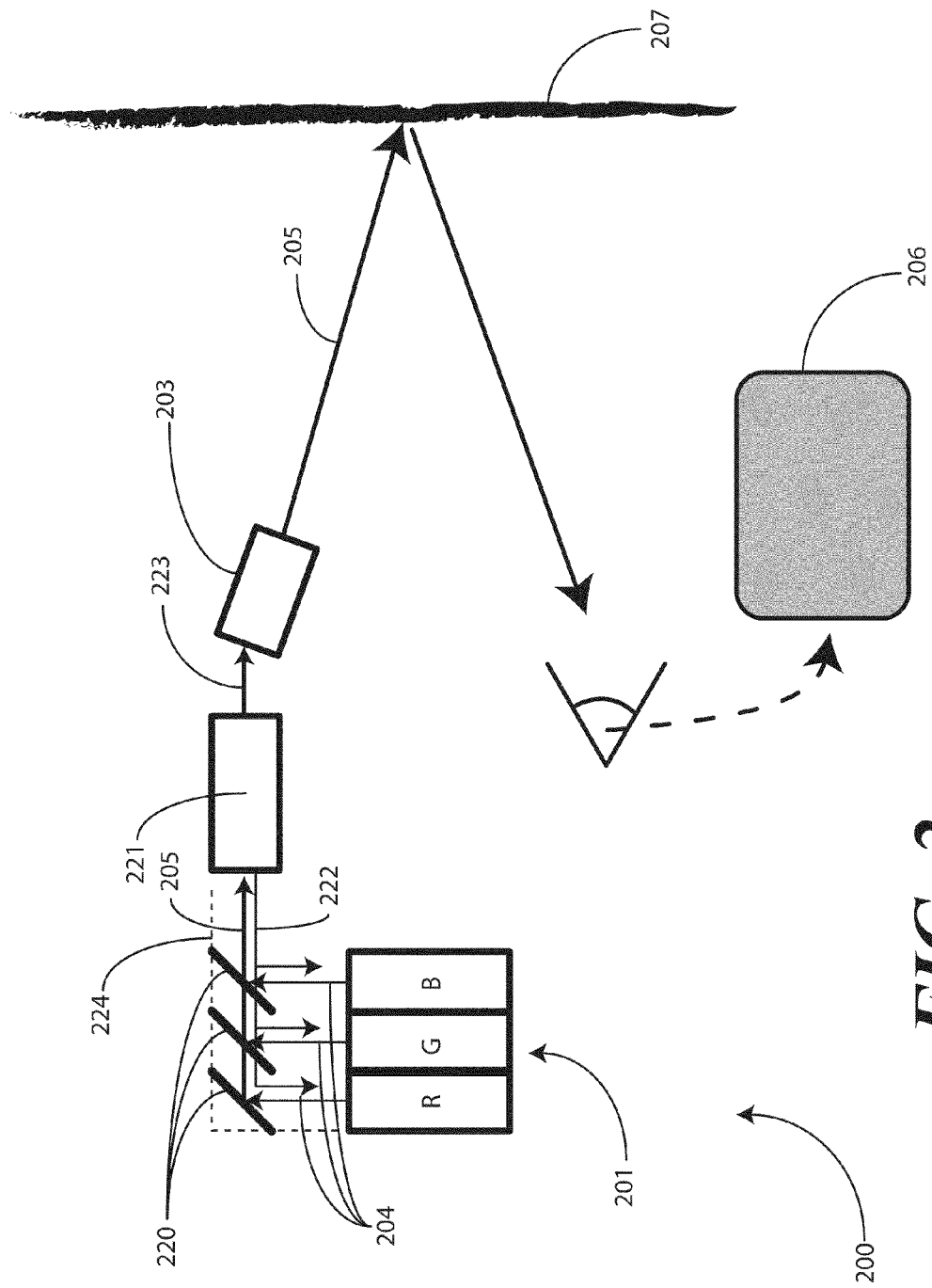
FIG. 2 illustrates one embodiment of a speckle reduction system in accordance with embodiments of the present invention.

Turning now to FIG. 2, illustrated therein is a general block diagram of a speckle reducing laser imaging system 200 in accordance with embodiments of the invention. A plurality of laser sources 201 is configured to produce a plurality of light beams 204. In one embodiment, the plurality of laser sources 201 comprises a red laser, a blue laser, and a green laser. These lasers can be edge emitting lasers or vertical cavity surface emitting lasers. In one embodiment, each laser is a semiconductor laser that is small and efficient. Such lasers are commonly available from a variety of manufacturers.

One or more optical alignment devices 220 are then used to orient the plurality of light beams 204 into a collimated light beam 205. Where the plurality of laser sources 201 comprise a red laser, blue laser, and green laser, the one or more optical alignment devices 220 can blend the output of each laser to form a coherent beam of white light. In one embodiment, dichroic mirrors can be used to orient the plurality of light beams 204 into the collimated light beam 205. Dichroic mirrors are partially reflective mirrors that include dichroic filters that selectively pass light in a narrow bandwidth while reflecting others. Dichroic mirrors and their use in laser-based projection systems are known in the art.

A light modulator 203 is then configured to produce images 206 by modulating the collimated light beam and delivering it to a display surface 207. In one embodiment, the light modulator 203 comprises a MEMS scanning mirror. Examples of MEMS scanning mirrors, such as those suitable for use with embodiments of the present invention, are set forth in commonly assigned, copending U.S. patent application Ser. No. 11/775,511, filed Jul. 10, 2007, entitled "Substrate-Guided Relays for Use with Scanned Beam Light Sources," which is incorporated herein by reference, and in US Pub. Pat. Appln. No. 2007/0159673, entitled, "Substrate-guided Display with Improved Image Quality," which is incorporated herein by reference. Embodiments of the invention are well suited for use with MEMS scanning mirrors as the overall system can be designed with a very small form factor, suitable for use in portable electronics such as mobile telephones, personal digital assistants, gaming devices, music players, multimedia devices, and so forth. However, it will be clear to those of ordinary skill in the art having the benefit of this disclosure that other light modulators, such as digital light projection modulators, may be used as well.

To reduce perceived speckle, an optical feedback device 221 is disposed between the plurality of laser sources 201 and the light modulator 203. In one embodiment, the optical feedback device 221 is disposed between the light modulator 203 and the one or more optical alignment devices 220. The optical axis running from the plurality of laser sources 201 and the optical feedback device 221 defines an external cavity 224 for each laser source. The optical feedback device 221 delivers a feedback component 222 to the plurality of laser sources 201, while delivering a projection component 223 to the light modulator 203. The feedback component 222 has amplitude sufficient to cause each of the plurality of laser sources 201 to operate in a state of coherence collapse. Coherence collapse causes considerable broadening of the spectral linewidth of the lasing modes of each of the plurality of laser sources 201. This reduces speckle appearing when images 206 from the light modulator 203 are displayed on the display surface 207. In effect, embodiments of the present invention exploit the coherence collapse phenomenon to suppress speckle effects in laser projection systems.

The external cavity 224, which gives rise to the coherence collapse of each laser source, is defined by the optical path length between the facets of each of the plurality of laser sources 201 to the optical feedback device 221. The length of this external cavity 224 may be selected such that the desired linewidth broadening of each laser source is insensitive to external cavity phase, i.e., sub-wavelength changes in the external cavity length. In one embodiment, the length of the external cavity 224 is chosen to be greater than the length below which the coherence collapse effect is not observed.

In one embodiment, the length of the external cavity 224 is selected to be an order of magnitude greater than the cavity length of each of the laser sources and less than the characteristic coherence length of each laser. For example, when using a red laser, blue laser, and green laser as the plurality of laser sources 201, the red laser may have a cavity length of roughly 1 millimeter, as will the blue laser. The green laser generally has a longer cavity length, such as 3-4 millimeters. The coherence length of each laser can run from several centimeters to hundreds of meters, but will often be on the order of tens of centimeters to a meter. Thus, the length of the external cavity 224 may be selected to be, for instance, about 10 millimeters long, which is greater than the cavity length of each laser source but less than the coherence length of the laser sources without feedback. In one embodiment of the invention, the length of the external cavity is between 0.1 and 100 millimeters.

The amplitude of the feedback component 222 is selected to be greater than that which is needed to destabilize the minimum linewidth mode of each laser. Such feedback begins to excite multiple modes in each laser source, with each of these multiple modes being separated by a relaxation oscillation frequency corresponding to the laser. As the amplitude of the feedback component 222 reaches a threshold, each laser source is driven into coherence collapse, thereby considerably broadening the spectral linewidth of each source. This broadening reduces speckle seen by a viewer.

In practice, the amount of feedback can be determined for a particular system or a particular manufacturer's laser diodes by employing a variable optical feedback device to tune the optical feedback to an amount sufficient to drive each of the plurality of laser sources 201 into coherence collapse. Once the proper amount of feedback is known, a system can be designed with a fixed optical feedback device having the desired reflectivity. The amount of feedback is at least enough as to destabilize a minimum linewidth mode of each of the laser sources. Experimental calculations based upon research show feedback having amplitude of approximately five percent of that of the collimated light beam 204 will cause sharp broadening in linewidth of each of the plurality of laser sources 201 due to the coherence collapse phenomenon. The coherence collapse phenomenon will be illustrated in more detail in FIGS. 3-5.

Figure 3:
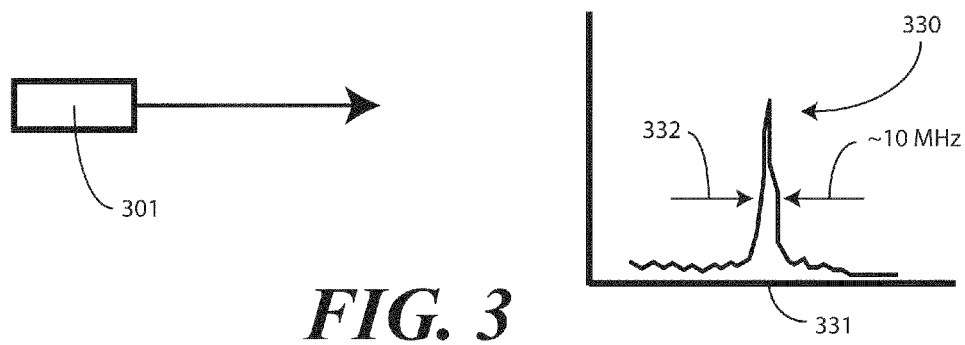
FIG. 3 illustrates a spectral view of a semiconductor-type laser suitable for use with embodiments of the present invention.

Turning now to FIG. 3, illustrated therein is a laser source 301 and a graph of its characteristic output 330 when no optical feedback is applied. The laser source 301 has an internal cavity length and a coherence length associated therewith. Where the laser source is a red laser, the cavity length may be on the order of 1 millimeter, while the coherence length may be between 10 and 100 centimeters.

The characteristic output 330 of the laser source is centered about a relaxation oscillation frequency 331 and has a spectral linewidth 332. For a typical semiconductor laser available from a given vendor, this spectral linewidth 332 may be roughly 10 MHz.

Figure 4:
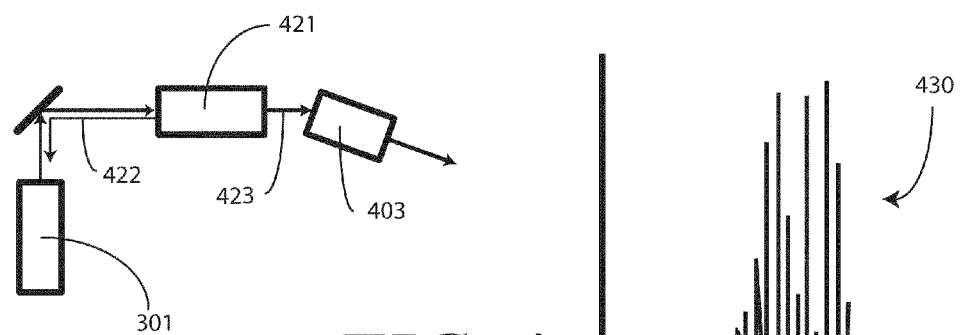
FIG. 4 illustrates a spectral view of a semiconductor-type laser being delivered a first amount of optical feedback in accordance with one embodiment of the invention.

Turning now to FIG. 4, illustrated therein is the laser source 301 having an optical feedback device 421 configured to deliver a feedback component 422 to the laser source 301 while delivering a projection component 423 to a light modulator 403 in accordance with embodiments of the invention. The amplitude of the feedback component 422 is relatively small, such as a few percent of the amplitude of the laser source's output. The amplitude of the feedback component 422 is sufficient as to destabilize the minimum linewidth mode of the laser source 401. As such, the output 430 of the system is a plurality of excited modes that are separated by the relaxation oscillation frequency of the laser source 301.

Figure 5:
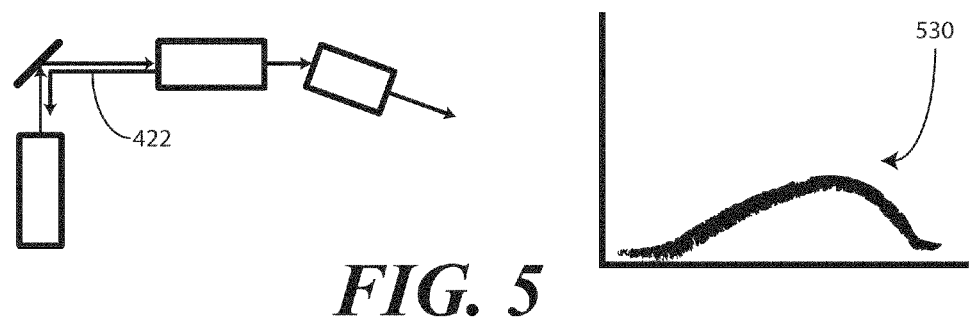
FIG. 5 illustrates a spectral view of a semiconductor-type laser being delivered a second amount of optical feedback in accordance with another embodiment of the invention.

Turning now to FIG. 5, illustrated therein is the system of FIG. 4, with the amplitude of the feedback component 422 increased to around five percent of the amplitude of the laser source's output. The multi-mode output (430) of FIG. 4 has now become an output 530 in a coherence collapsed state. The initial spectral linewidth (332) of 10 MHz has now spread into a spectral linewidth of between 10 and 20 GHz. This broadening of the spectral linewidth reduces the combinative effects of light reflecting from a display surface (207), thereby reducing speckle.

Operational states of coherence collapse are often avoided in industry because such states cause the relative intensity noise to increase dramatically. However, while the increase in relative intensity noise may be deleterious in applications such as optical communication systems, it does not degrade performance of embodiments of the present invention. Applications for embodiments of the present invention, such as projection display applications, do not suffer from increases in relative intensity noise because detectors such as the human eye average this increased noise. As a result, projected images in accordance with embodiments of the present invention suffer no adverse image quality effects from increased relative intensity noise. Further, any increased noise may average out image artifacts caused by laser self-heating and other operational characteristics.

Additionally, some prior art speckle reduction systems have attempted to use the "multi-mode" state of operation shown in FIG. 4 to reduce speckle. However, such prior art systems generally require post modulator radiation alteration. For example, prior art solutions in microscopes employ a single laser light source and then use extensive lengths of fiber optic cable in an attempt to deliver light at a distance from the source that exceeds the coherence length of the laser source. Embodiments of the present invention are not only able to use multiple laser light sources, but have no need for post modulator radiation alteration as each laser is drive into coherence collapse.

Figure 6:
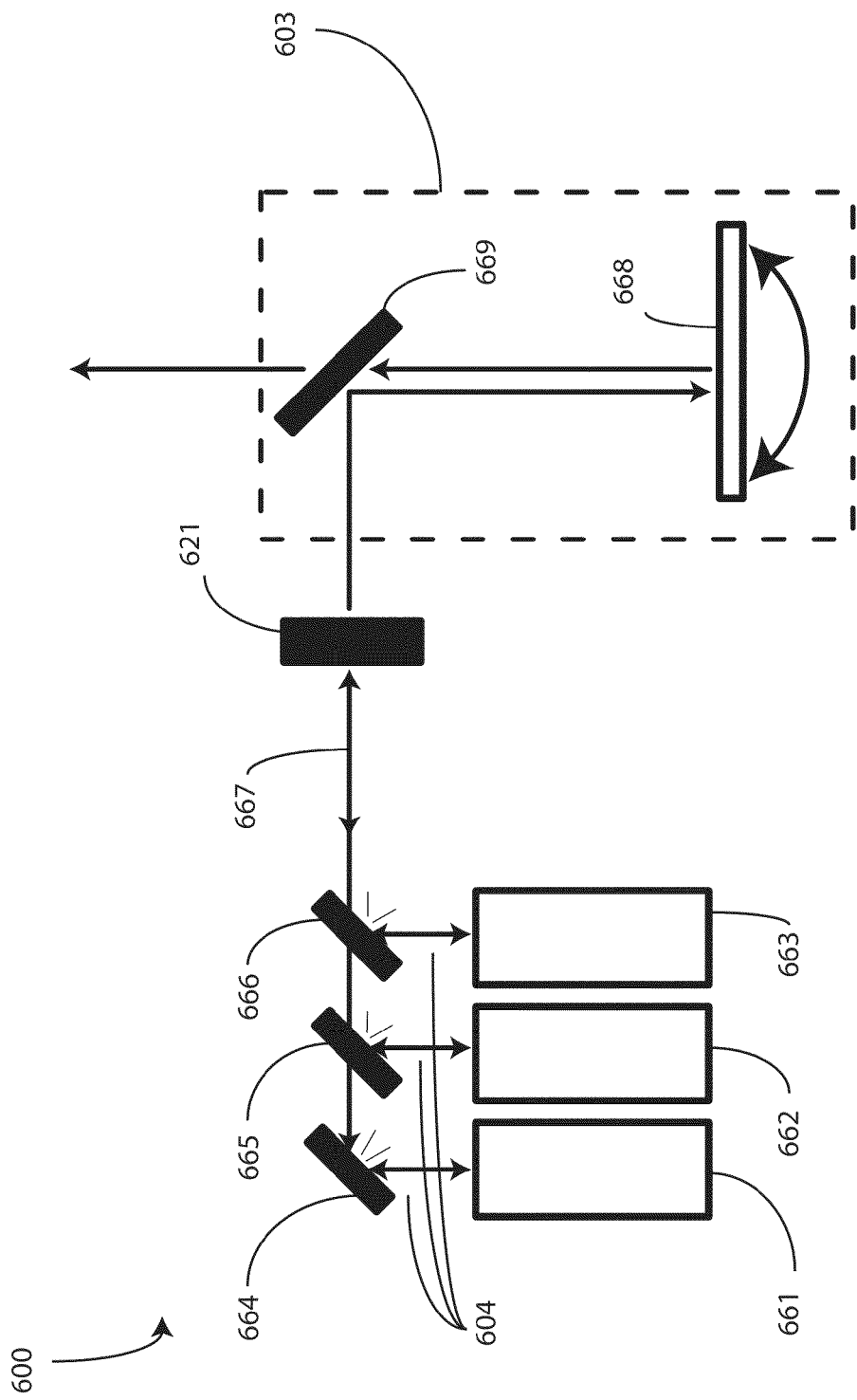
FIG. 6 illustrates one embodiment of an imaging system configured to reduce speckle in accordance with embodiments of the invention.

Turning now to FIG. 6, illustrated therein is one embodiment of a light projection source 600 in accordance with embodiments of the invention. Three laser light sources 661, 662, 663 are oriented so as to produce a plurality of light beams 604. Each laser light source 661,662,663 has a characteristic minimum linewidth mode and a coherence length associated therewith. In one embodiment, the laser light sources 661,662,663 comprise a green laser light source, a red laser light source, and a blue laser light source. In one embodiment, each laser light source 661,662,663 comprises a semiconductor laser source suitable for mounting on a printed wiring board or other substrate.

A plurality of optical alignment 664,665,666 is configured to direct output light from each of the laser light sources 661,662,663 along an optical axis 667 as a coherent, collimated light beam. In the illustrative embodiment of FIG. 6, the plurality of optical alignment devices 664,665,666 each comprise dichroic mirrors. It will be clear to those of ordinary skill in the art having the benefit of this disclosure that other optical alignment devices configured to direct multiple light beams into a single collimated light beam may also be used.

A light modulator 603 receives the collimated light and modulates it so as to produce images suitable for projection onto a display surface (207). In the illustrative embodiment of FIG. 6, the light modulator 603 comprises a MEMS scanning mirror 668. A partially reflecting mirror 669 directs the collimated light to the MEMS scanning mirror 668. As noted above, other light modulating devices, such as digital light projection systems, may be used in place of the MEMS scanning mirror 668. An advantage of the MEMS scanning mirror 668 is that it facilitates a very small, efficient light projection source 600.

An optical feedback component 621 is then configured to reflect a feedback component of light along the optical axis 667 to the three laser light sources 661,662,663, thereby causing destabilization and spreading of each minimum linewidth mode. In one embodiment, the amplitude of the feedback component is selected so as to drive each of the three laser light sources 661,662,663 into a coherence collapsed state.

In the illustrative embodiment of FIG. 6, the optical feedback component 621 comprises a mirror having a partially reflective coating. Partially reflective coatings are generally known to those of ordinary skill in the art. Such coatings can be used to reflect some components of incident light and transmit others. Further, such coatings can be used transmit or reflect certain levels of light, or amounts of light that depend upon polarization. These coatings can be metallic layers—such as thin layers of silver. Alternatively, they may be multilayer structures deposited by a vapor deposition process or other suitable manufacturing process. Additional details about the construction of suitable partially reflective coatings may be found in application Ser. No. 11/603,964, entitled "Substrate-Guided Display with Improved Image Quality," filed Nov. 21, 2006 and incorporated by this reference in its entirety.

Some coatings can be configured to preferentially reflect incident rays across a particular range of angles. For example, several monolithic layers of partially reflecting material can be configured to exhibit a polarization preference, and angle preference, or a combination thereof. Alternatively, separate angle preferential and polarization preferential partial reflective layers may be used, with each layer contributing a portion of the reflected energy.

In one embodiment, the partially reflective coating on/in the optical feedback component 621 is configured to reflect between one and ten percent of the combined light beam coming from the plurality of optical alignment devices 664, 665,666. In one embodiment, the partially reflective coating comprises a multi-layer coating. For example, the partially reflective coating can be configured to deliver feedback corresponding with a respective spectral width of each laser light source 661,662,663. By delivering the optical feedback, each laser light source 661,662,663 is driven into coherence collapse, thereby reducing perceived speckle from the light projection source 600.

Figure 7:
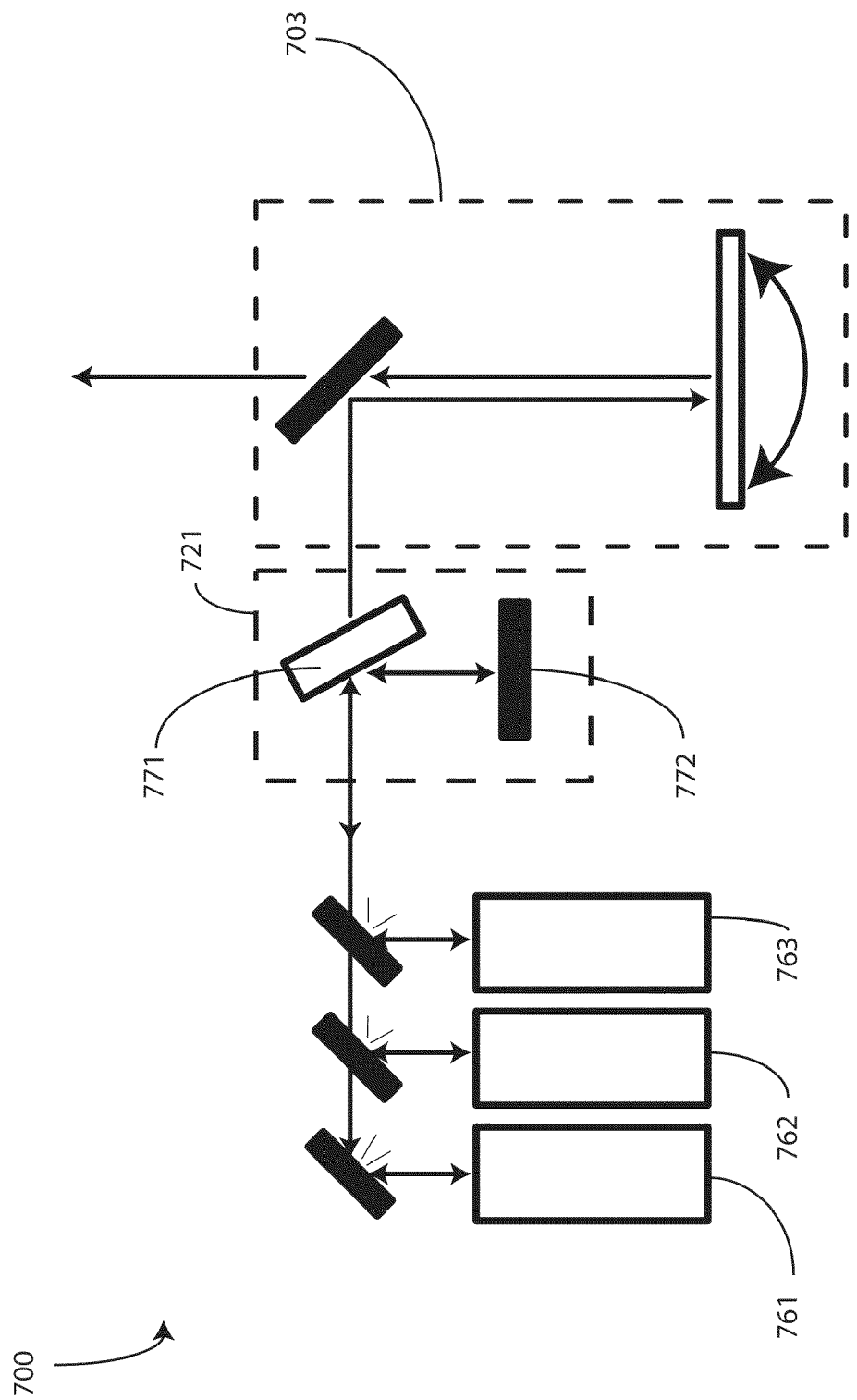
FIG. 7 illustrates an alternate embodiment of an imaging system configured to reduce speckle in accordance with embodiments of the invention.

Turning now to FIG. 7, illustrated therein is an alternate embodiment of a light projection source 700 in accordance with embodiments of the invention. In FIG. 7, the optical feedback component 721 comprises a beam splitter 771 and mirror 772 combination. Beam splitters, well known to those of ordinary skill in the art, are devices that split a beam of light into multiple components. In embodiments of the present invention, the beam splitter 771 is configured to split the received beam into a feedback component and a projection component. The beam splitter 771 delivers the feedback component, which may be between one and ten percent of the received collimated light beam, to the mirror 772. The feedback component reflects off the mirror 772 and is delivered back to the laser light sources 761,762,763, thereby causing coherence collapse. The projection component is delivered to the light modulator 703 such that images can be formed on a display surface (207). Beam splitters 771 suitable for use with the invention can take many forms, including cubed prisms, half-silvered mirrors, and dichroic mirrored prism assemblies.

Figure 8:
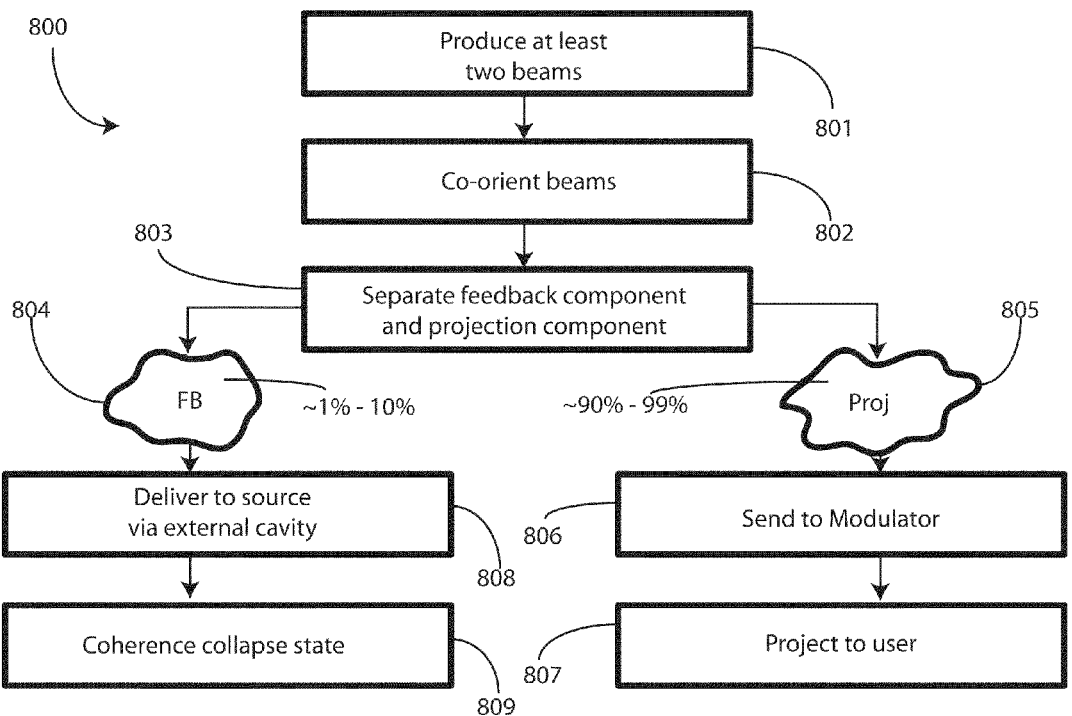
FIG. 8 illustrates one method of reducing speckle in accordance with embodiments of the invention.

Turning now to FIG. 8, illustrated therein is one method 800 of reducing speckle associated with an image presentation on a display surface that is suitable for use with embodiments of the present invention. At step 801, a plurality of light sources produces at least two beams of light. At step 802, one or more optical alignment devices orient the at least two light beams into a collimated beam. At step 803, an optical feedback device separates the collimated beam into a projection component 805 and a feedback component 804. In one embodiment, the projection component amplitude is between one and ten percent of the amplitude of the collimated light beam. This step 803 can include the step of disposing the feedback component between 0.1 millimeters and 100 millimeters away from the laser light sources along an optical axis running from the laser light sources to the optical feedback device.

At step 806, the optical feedback device delivers the projection component to a modulation device so that images can be projected to a user at step 807. The modulation device forms the image presentation and delivers the image presentation to the display surface for viewing. At step 808, the optical feedback device delivers the feedback component 804 to the laser light sources, thereby causing each of the laser light sources to operate in a coherence collapsed state at step 809.

Figure 9:
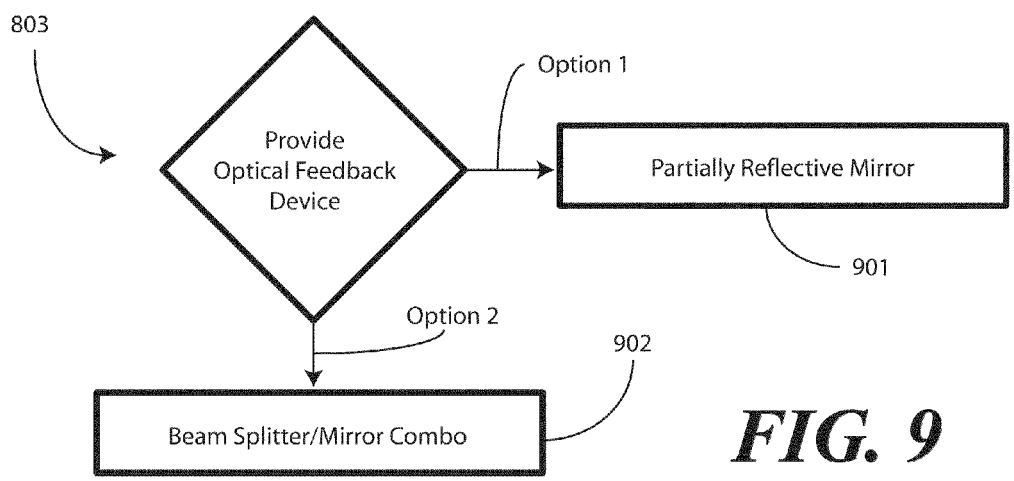
FIG. 9 illustrates one sub-method step of the method of FIG. 8.

Turning now to FIG. 9, illustrated therein are two optional ways step 803 of FIG. 8 can be carried out. Specifically, the step 803 of separating the collimated beam into the projection component and the feedback component can comprises either the step 901 of providing a partially reflective mirror or the step 902 of providing a system comprising a beam splitter and mirror. It will be clear to those of ordinary skill in the art having the benefit of this disclosure that the steps of FIG. 9 are illustrative only, as other types of optical feedback devices may be supplied in lieu of a partially reflective mirror or a beam splitter/mirror combination.

Figure 10:
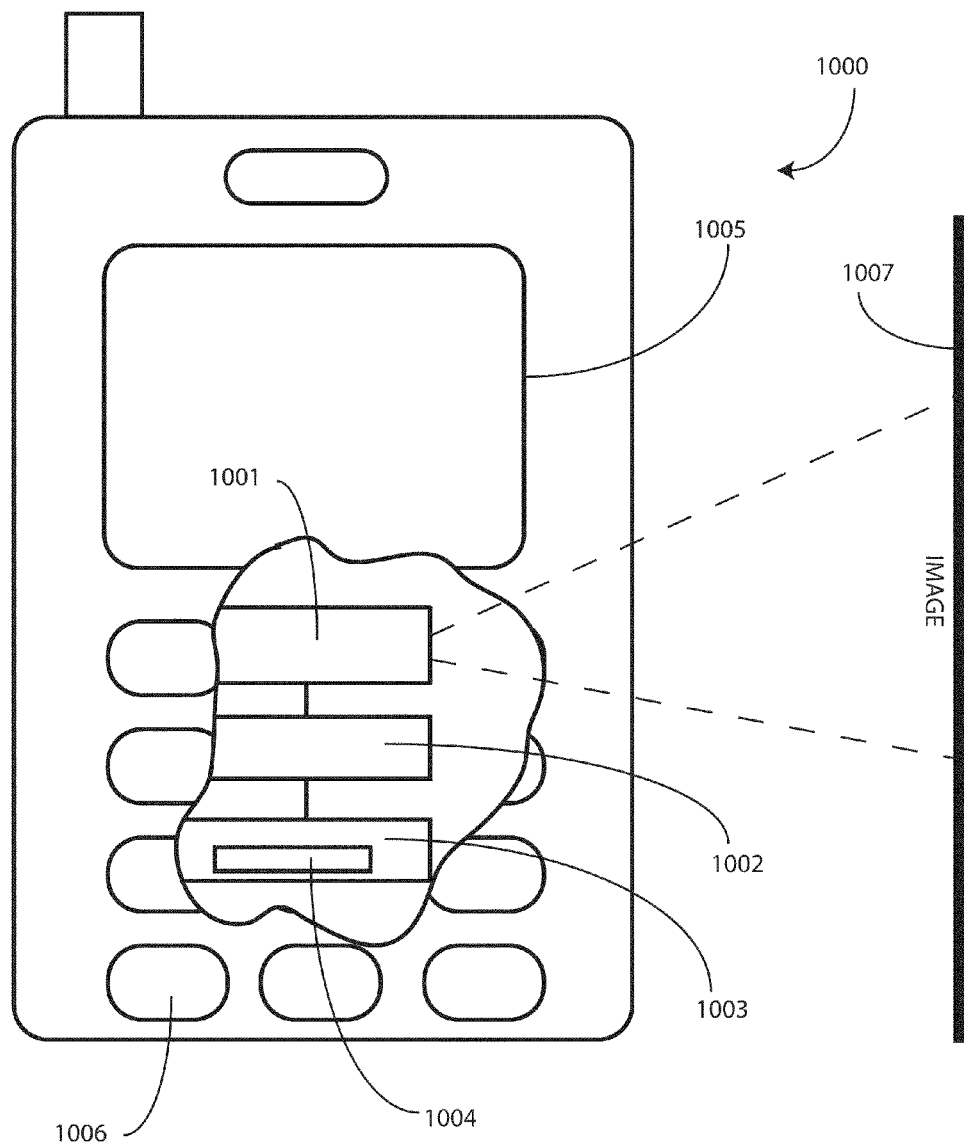
FIG. 10 illustrates one application for an imaging system in accordance with embodiments of the invention.

Turning now to FIG. 10, illustrated therein is an exemplary application for an imaging system (200) in accordance with embodiments of the invention. Specifically, imaging systems (200) as set forth herein may be incorporated into a device 1000. The device 100 may be any of a mobile telephone, a portable DVD player, a portable television device, a laptop, a portable e-mail device, a portable music player, a personal digital assistant, or any combination of the same.

The device 1010 may include a projector 1001 incorporating any one or more of the foregoing speckle reduction apparatuses and configured to execute any one or more of the foregoing speckle reduction methods. The projector 1001, in one embodiment, is coupled to a processor 1002 programmed to control the projector 1001. The projector 1001 includes the laser light sources (201) and the optical feedback component (221) and other speckle reduction components described herein.

The processor 1002 may be coupled to a memory 1003 storing image data 1004, which may include either still image or video data. The processor 1002 may be programmed to process the image data to generate control signals causing the projector 1001 to create an image corresponding to the image data 1004 on the display surface 1007. The processor 1007 may also be coupled to one or more input and output devices. For example a display 1005 may enable a user to view the status of operation of the processor 1002 and may serve as an alternative means for displaying the image data 1004. The processor 1002 may also be coupled to a keypad 1006 for receiving user inputs and control instructions.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. A method of reducing speckle associated with an image presentation on a display surface, the method comprising the steps of:

producing at least two beams of light from laser light sources;

orienting the at least two beams of light into a collimated beam;

separating the collimated beam into a projection component and a feedback component;

delivering the projection component to a modulation device; and delivering the feedback component to the laser light sources, thereby causing each of the laser light sources to operate in a coherence collapsed state.

2. The method of claim 1, further comprising the step of causing the modulation device to form the image presentation and to deliver the image presentation to the display surface.

3. The method of claim 1, wherein the feedback component comprises between one and ten percent of the collimated beam.

4. The method of claim 1, wherein the step of separating the collimated beam into the projection component and the feedback component comprises the steps of providing one of a partially reflective mirror or a system comprising a beam splitter and mirror.

5. The method of claim 4, wherein the step of separating the collimated beam into the projection component and the feedback component comprises disposing the feedback component between 0.1 millimeters and 100 millimeters away from the laser light sources along an optical axis running from the laser light sources to the feedback component.

\* \* \* \* \*